(12) United States Patent
Proudfoot et al.

(10) Patent No.: US 8,400,063 B2
(45) Date of Patent: Mar. 19, 2013

(54) PLASMA SOURCES

(75) Inventors: Gary Proudfoot, Oxford (GB);
Christopher David George, Bristol (GB); Paulo Eduardo Lima, Grenoble (FR)

(73) Assignee: Aviza Technology Limited, Newport, South Wales (GB)

( * ) Notice: Subject to any disclaimer, the term of this patent is extended or adjusted under 35 U.S.C. 154(b) by 742 days.

(21) Appl. No.: 12/309,461

(22) PCT Filed: Jul. 6, 2007

(86) PCT No.: PCT/GB2007/002550
§ 371 (c)(1),
(2), (4) Date: Nov. 3, 2009

(87) PCT Pub. No.: WO2008/009892
PCT Pub. Date: Jan. 24, 2008

(65) Prior Publication Data
US 2010/0108905 A1 May 6, 2010

Related U.S. Application Data

(60) Provisional application No. 60/832,378, filed on Jul. 20, 2006.

(30) Foreign Application Priority Data

Jul. 21, 2006 (GB) .................... 0614500.7

(51) Int. Cl.
*H01J 7/24* (2006.01)
*H05B 31/26* (2006.01)

(52) U.S. Cl. ............... 315/111.71; 315/111.21

(58) Field of Classification Search ............. 315/111.21, 315/111.31, 111.41, 111.71
See application file for complete search history.

(56) References Cited

U.S. PATENT DOCUMENTS

| | | | |
|---|---|---|---|
| 3,864,797 A | | 2/1975 | Banks |
| 3,952,228 A | * | 4/1976 | Reader et al. ............ 315/111.81 |
| 4,232,244 A | | 11/1980 | Fink et al. |
| 4,447,773 A | | 5/1984 | Aston |
| 4,857,800 A | | 8/1989 | Ohkoshi et al. |
| 4,987,346 A | | 1/1991 | Katzschner et al. |
| 4,992,665 A | | 2/1991 | Mohl |
| 5,036,252 A | | 7/1991 | Lob |
| 5,107,170 A | * | 4/1992 | Ishikawa et al. ........... 313/362.1 |
| 5,296,122 A | | 3/1994 | Katsube et al. |

(Continued)

FOREIGN PATENT DOCUMENTS

| EP | 0 360 608 A1 | 3/1990 |
|---|---|---|
| EP | 0 496 564 A1 | 7/1992 |

(Continued)

OTHER PUBLICATIONS

Great Britain Search Report for GB0614499.2 dated Nov. 22, 2006, 1 pg. claims searched 1.

(Continued)

*Primary Examiner* — Minh D A
(74) *Attorney, Agent, or Firm* — Volentine & Whitt, PLLC

(57) ABSTRACT

This invention relates to a plasma source in the form of plasma generator (13) which utilizes an antenna (11) and an RF source (12). The generated plasma flows into a chamber (14) and ions are accelerated out of the chamber (14) by grid (15). A body 16 is located in the volume for creating local losses and thereby reducing local plasma density.

17 Claims, 1 Drawing Sheet

U.S. PATENT DOCUMENTS

Figure 1:
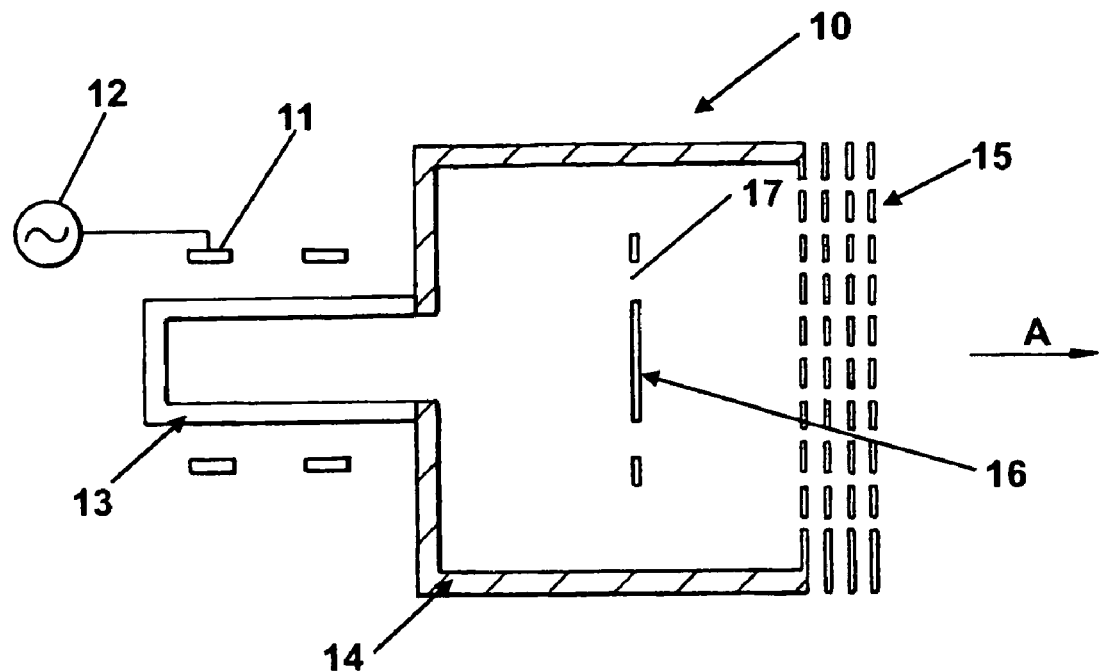

| | | | |
|---|---|---|---|
| 5,393,986 A | 2/1995 | Yoshinouchi et al. | |
| 5,786,039 A | 7/1998 | Brouquet | |
| 5,871,622 A | 2/1999 | Pinarbasi | |
| 5,874,367 A | 2/1999 | Dobson | |
| 5,924,277 A | 7/1999 | Beattie et al. | |
| 6,214,698 B1 | 4/2001 | Liaw et al. | |
| 6,224,718 B1 | 5/2001 | Meyer | |
| 6,246,162 B1 | 6/2001 | Kahn et al. | |
| 6,339,206 B1 * | 1/2002 | Johnson | 219/121.43 |
| 6,346,768 B1 | 2/2002 | Proudfoot | |
| 6,387,989 B1 | 5/2002 | Sulzbach et al. | |
| 6,395,156 B1 | 5/2002 | Hsueh et al. | |
| 6,395,647 B1 | 5/2002 | Li et al. | |
| 6,464,891 B1 * | 10/2002 | Druz et al. | 216/67 |
| 6,544,858 B1 | 4/2003 | Beekman et al. | |
| 6,724,160 B2 * | 4/2004 | Kaufman et al. | 315/500 |
| 6,870,164 B1 * | 3/2005 | Baldwin et al. | 250/423 R |
| 2002/0060201 A1 | 5/2002 | Yeom et al. | |
| 2002/0175296 A1 | 11/2002 | Kimura et al. | |
| 2002/0185226 A1 | 12/2002 | Lea et al. | |
| 2003/0047536 A1 | 3/2003 | Johnson | |
| 2003/0157781 A1 | 8/2003 | Macneil et al. | |
| 2003/0227258 A1 | 12/2003 | Strang et al. | |
| 2004/0023125 A1 | 2/2004 | Osamu et al. | |
| 2004/0084299 A1 | 5/2004 | Slaughter | |
| 2004/0163766 A1 * | 8/2004 | Kanarov et al. | 156/345.49 |
| 2004/0212288 A1 | 10/2004 | Kanarov et al. | |
| 2005/0159010 A1 | 7/2005 | Bhardwaj et al. | |
| 2005/0194097 A1 | 9/2005 | Uchiyama | |
| 2005/0241767 A1 | 11/2005 | Ferris et al. | |
| 2006/0019039 A1 | 1/2006 | Hanawa et al. | |
| 2006/0060795 A1 | 3/2006 | Takeuchi et al. | |

FOREIGN PATENT DOCUMENTS

| | | |
|---|---|---|
| EP | 0 532 283 | 3/1993 |
| GB | 1057119 | 2/1967 |
| GB | 1138212 | 12/1968 |
| GB | 1295465 | 11/1972 |
| GB | 2 295 485 A | 5/1996 |
| GB | 2 327 909 | 2/1999 |
| GB | 2 364 434 | 1/2002 |
| JP | 58-189952 | 11/1983 |
| JP | 4-194372 A | 7/1992 |
| JP | 5-74361 A | 3/1993 |
| JP | 7-169426 | 7/1995 |
| JP | 7-230987 | 8/1995 |
| JP | 8-139024 | 5/1996 |
| JP | 08 335447 | 12/1996 |
| JP | 9092490 A | 4/1997 |
| JP | 11135488 A | 5/1999 |
| JP | 2001 20068 | 1/2001 |
| JP | 2003-17472 | 1/2003 |
| JP | 2003017472 A | 1/2003 |
| JP | 2004079465 A | 3/2004 |
| WO | WO 98/14977 A1 | 4/1998 |
| WO | WO 98/18150 A1 | 4/1998 |
| WO | WO 00/36631 A1 | 6/2000 |
| WO | WO 01/22470 A1 | 3/2001 |
| WO | WO 02/33725 A2 | 4/2002 |
| WO | WO 02/097850 A2 | 12/2002 |
| WO | WO 2005/024881 A2 | 3/2005 |
| WO | WO 2008/009892 A1 | 1/2008 |

OTHER PUBLICATIONS

Spaepen, F. et al., "Ion Beam Sputtering Apparatus for Fabrication of Compositionally Modulated Materials," Review of Scientific Instruments, AIP, Melville, NY, US, vol. 56, No. 7, Jul. 1985, pp. 1340-1343.

International Search Report and Written Opinion for PCT/GB2007/002550 dated Oct. 12, 2007, 13 pages.

International Search Report and Written Opinion for PCT/GB2007/002614 dated Nov. 2, 2007, 13 pages.

International Search Report for PCT/GB2007/002537 dated Dec. 14, 2007, 5 pages.

Great Britain Search Report for GB0614500.7 dated Nov. 29, 2006, 1 pg. claims searched all.

Great Britain Search Report for GB0614501.5 dated Nov. 29, 2006, claims searched 1-15.

Great Britain Search Report for GB0614501.5 dated Jun. 1, 2007, 1 page, claims searched 16 to 18.

Great Britain Search Report for GB0614501.5 dated Jun. 1, 2007, 1 page, claim searched 19.

Great Britain Search Report for GB0614499.2 dated Jul. 2, 2007, 1 pg, claims searched 6-31.

* cited by examiner

PLASMA SOURCES

CROSS REFERENCE TO RELATED APPLICATIONS

This application is a United States National Stage Application filed under 35 U.S.C. §371 of PCT Patent Application Serial No. PCT/GB2007/002550 filed on Jul. 6, 2007, which claims the benefit of and priority to Great Britain (GB) Patent Application Serial No. 0614500.7 filed on Jul. 21, 2006 and U.S. Provisional Patent Application Ser. No. 60/832,378 filed on Jul. 20, 2006, the disclosures of both of which are hereby incorporated by reference in their entirety.

This invention relates to plasma sources.

Plasma sources are used in many different arrangements including ion beam sources and a variety of etch and deposition tools. Such sources typically include a chamber for containing the plasma and it is well known that the plasma density is reduced adjacent the walls of the chamber due to interactions between the plasma and the chamber wall. This lack of uniformity can result in processed non-uniformity on the work pieces which are processed by processes involving the plasma.

The almost universal solution to date has been to surround the chamber with magnets or electro-magnets to create a field, which tends to reduce the rate at which electrons can reach the chamber wall. This in turn reduces the rate of ion loss to the wall and improves overall uniformity at the process plane by virtue of increased plasma density at the edge. This solution is often only partially successful and the longitudinal magnetic field passing through the chamber can produce other effects, which may not always be desirable.

However, uniformity of process is highly desirable, because the manufacturers of semi conductors devices and the like demand that every device formed on a work piece has the same characteristics.

From one aspect the invention consists in a plasma source including a plasma generator, a chamber having a volume for the plasma and a body located in the volume for creating local losses and thereby reducing local plasma density to determine the gradient of the plasma density across the volume.

In a preferred arrangement the plasma density is made more uniform across the chamber.

The Applicants have realised that there is, surprisingly, a completely different approach to the problem of plasma uniformity or achieving a preferred plasma gradient, which is to reduce the higher plasma density, which typically occurs towards the centre of the plasma, so that the density across the whole plasma is significantly more uniform or graduated as required. This can be used in combination with the traditional magnetic approach or alternatively it can be used alone.

Conveniently the body is generally planar and may lie in a general lateral plane in the chamber. The body may have one or more cut-outs or openings and indeed there may be more than one body. The bodies may be co-planar or alternatively they may be spaced and generally parallel.

In an alternative arrangement the body may be arranged generally axially within the chamber and there may be a number of spaced parallel bodies.

Where the body is located in an RF field it should be formed from an insulator. Otherwise the body may be a conductor. The body may be any suitable shape, but for manufacturing reasons a regular geometrical shape such as triangular, circular, diamond shaped, square or rectangular bodies are particularly suitable. Three dimensional and/or irregular shapes may be used.

The plasma source may be part of an ion source. Equally it may be substituted for antennae configurations or other plasma sources. Any appropriate mode of generating plasma may be used.

From a further aspect the invention consists in an ion source for creating a low power ion beam of 100V or less including a plasma generator having an input power of above about 100 W, a plasma chamber and at least a body located in the plasma chamber for absorbing power from a plasma contained in the chamber.

In this arrangement, the problems associated with running ion sources with very low input powers to created lower power beams can be overcome by running the source at higher powers and then using the body to absorb sufficient power to reduce the ion beam to the desired level.

Although the invention has been defined above it is to be understood that it includes any inventive combination of the features set out above or in the following description.

Figure 2:
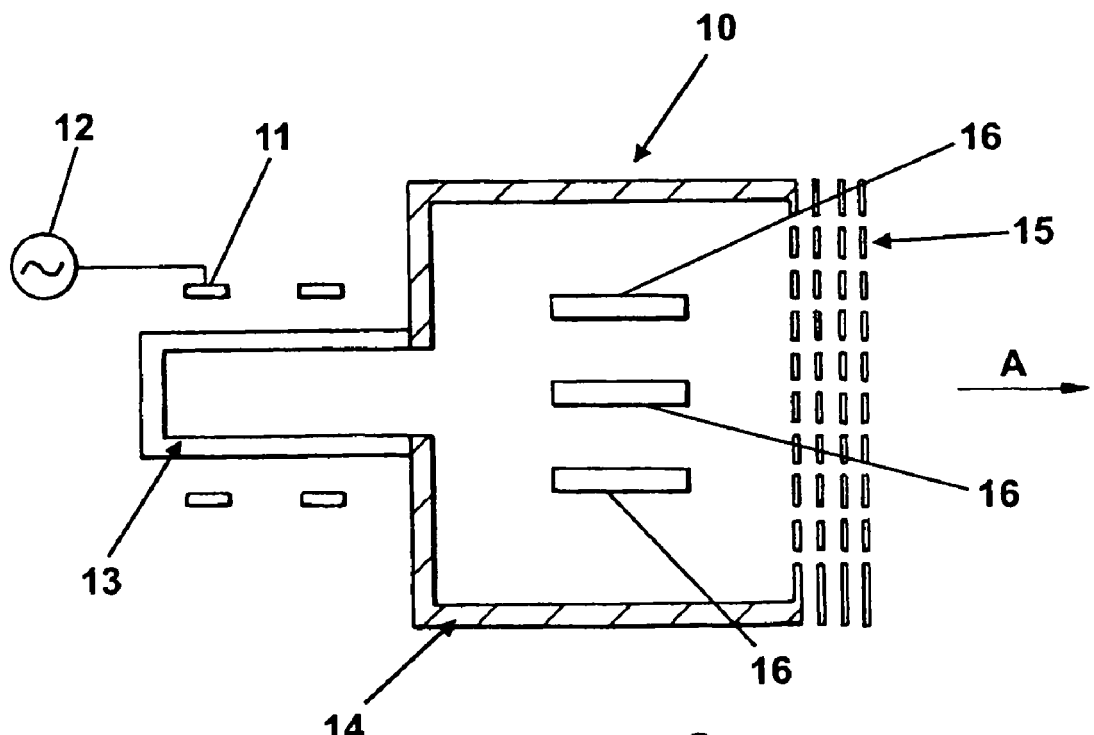

The invention may be performed in various ways and specific embodiments will now be described, by way of example, with reference to the accompanying drawings in which:

FIG. 1 is a schematic cross-section through a first embodiment of an ion source; and FIG. 2 is a corresponding view through an alternative construction.

An ion source generally indicated at 10 includes an antenna 11 powered by an RF source 12 and surrounding a plasma generation chamber 13, plasma source or containment chamber 14 and an accelerator grid 15. Such an arrangement is more specifically described in the co-pending application Serial No. PCT/GB2007/002537 entitled Ion Deposition Apparatus filed on Jul. 6, 2007, which claims the benefit of U.S. Provisional Patent application Ser. No. 60/832,474 filed on Jul. 20, 2006, the entire disclosures of both of which are herein incorporated by reference. Broadly a plasma is struck in the plasma generator 13 using the antenna 11 and RF source 12. The plasma flows into the chamber 14 and ions are accelerated out of the chamber 14 by grid 15 to form a stream of ions indicated by the arrow A.

The Applicants have inserted a body 16 to extend laterally across a generally central portion of the chamber 14. The size, shape and location of the body 16 are selected to absorb sufficient power from the plasma struck in the chamber 14 so as to reduce locally the plasma density in such a way that the density of the plasma, as seen by the grid 15 is essentially uniform across the width of the chamber 14 or to achieve some desired profile of non-uniformity.

The size, shape and location can be determined empirically. The body 16 may be provided with openings or perforations 17 to allow for local fine tuning.

When a lateral body of this type is used, it will also affect the flow of ions through the chamber, as well the presence or absence of opening 17. This can be used to displace ion flow towards the chamber walls again enhancing uniformity. More than one body can be used and the addition of further bodies 16 will often persist in fine tuning.

As has already been mentioned, the ion source is only one example of a plasma generation device and the principals discussed above can equally well be applied to other plasma generation devices.

As well as being used to alter the level of non-uniformity within the plasma, a body or bodies 16 can be used to absorb power from the ion beam. This can be particularly effective for applications where low energy process beams are required (eg 100V or less). Typically applications requiring low energy process beams demand a plasma density in the region of 0.2 $mAcm^{-2}$, with good uniformity. However this means that they tend to be operated at input powers in the region of 20 W where it is extremely difficult to control the device. In contrast, the Applicants have appreciated, that by utilising the arrangement shown in FIG. 1, the ion source can be operated in a well controlled region e.g. an input power of 150 W. The body or bodies 16 are then designed to absorb sufficient power and provide the appropriate uniformity.

If power absorption or control of plasma density is the sole requirement, then the body or bodies 16 may be aligned longitudinally with in the chamber 14 as illustrated in FIG. 2. Arrangement lying between the orientations of FIGS. 1 and 2 may also be utilised.

The positioning requirements vary depending on the geometry of the apparatus, but in general the insert should not be place too close to the antenna region of primary plasma generation such that it affects the flow of plasma into the chamber 14. Equally if the body 16 is too close to the grid 15 or process plane, it may effectively block the grid 15. Within these limits the longitudinal position of the body may be selected in accordance with the effect that is desired. There is some suggestion from experiment, that the diffusion length of the expansion box is sensitive to changes of the insert axial location of the order of 5 mm. A diffusion length of half the radius of the insert, measured across the short axis of the chamber 14, has proved to be acceptable. In general it has been found that it is useful to have an insert which follows the symmetry of the chamber 14.

The invention claimed is:

1. A plasma source comprising: a plasma generator that generates plasma and includes a plasma generation chamber containing a region in which plasma is created by the plasma source is initiated; a containment chamber communicating with the plasma generation chamber and having chamber walls delimiting a volume of space located in the plasma source downstream of the region in which plasma is initiated in the plasma source such that the containment chamber contains the plasma; and at least one body located in the volume of space and configured to create local losses in the power of the plasma and thereby reduce local plasma density and establish the gradient of the plasma density across the volume, wherein the plasma generator further comprises an antenna surrounding the plasma generation chamber, whereby the at least one body is located in the plasma source downstream of the region surrounded by the antenna.

2. A plasma source as claimed in claim 1 wherein the body is generally planar.

3. A plasma source as claimed in claim 2 wherein the body lies in a generally lateral plane in the containment chamber.

4. A plasma source as claimed in claim 1 wherein the body has cut-outs or openings.

5. A plasma source as claimed in claim 1 wherein the body is located generally centrally in the lateral plane of the containment chamber.

6. A plasma source as claimed in claim 1 wherein the body is an insulator.

7. A plasma source as claimed in claim 1 wherein the body is a conductor.

8. A plasma source as claimed in claim 1 wherein, in use, the plasma generator generates a non-uniform plasma and the body is disposed at a location in the volume of space where the highest plasma density would be present absent the body.

9. A plasma source as claimed in claim 1 wherein the body is generally triangular, circular, diamond shaped, square or rectangular.

10. A plasma source as claimed in claim 1 wherein there is more than one body.

11. A plasma source as claimed in claim 10 wherein the bodies are spaced and generally parallel.

12. A plasma source as claimed in claim 1 wherein the source is part of an ion source.

13. An ion source for creating a low power ion beam of 100V or less, comprising: a plasma generator including a chamber in which plasma is initiated, and a power source coupled to the chamber and that inputs power of above about 100 W to source gas in the chamber; a containment chamber that contains plasma and ions of the ion source, the containment chamber having one end at which the containment chamber communicates with the chamber of the plasma generator and chamber walls delimiting a volume of space located in the ion source downstream of the region in which plasma is initiated in the plasma generator, wherein the volume of space delimited by the chamber walls of the containment chamber contain the plasma initiated in the chamber of the plasma generator; and at least a body located in the containment chamber and configured to absorb power from a plasma contained in the containment chamber, wherein the plasma generator further comprises an antenna surrounding the chamber of the plasma generator chamber and coupling the power source to said chamber, whereby the at least one body is located in the plasma source downstream of the region surrounded by the antenna.

14. The ion source as claimed in claim 13, further comprising an accelerator grid disposed over the other end of the containment chamber, wherein ions generated by the ion source are accelerated out of the containment chamber by the accelerator grid.

15. An energy source comprising: a plasma generator that includes a plasma generation chamber in which plasma created by the energy source is initiated; a containment chamber into which the plasma generation chamber opens such that plasma in the plasma generation chamber flows into the containment chamber, and wherein the interior of the containment chamber is wider than the interior of the plasma generator in a direction perpendicular to the direction in which plasma flows into the containment chamber from the plasma generation chamber; and at least one body located in the containment chamber and configured to create local losses in the power of the plasma and thereby reduce local plasma density and establish the gradient of the plasma density across the wherein the plasma generator further comprises an antenna surrounding the plasma generation chamber, whereby the at least one body is located in the plasma source downstream of the region surrounded by the antenna.

16. The energy source as claimed in claim 15, further comprising an accelerator grid disposed over the other end of the containment chamber, wherein ions generated by the energy source are accelerated out of the containment chamber by the accelerator grid.

17. The energy source as claimed in claim 15 further comprising an accelerator grid disposed over an end of the containment chamber, wherein ions generated by the ion source are accelerated out of the containment chamber by the accelerator grid and the at least one body is located in the plasma source between the region surrounded by the antenna and the accelerator grid.

* * * * *